(12) United States Patent
Kikuchi

(10) Patent No.: US 12,401,325 B2
(45) Date of Patent: Aug. 26, 2025

(54) DOHERTY AMPLIFIER

(71) Applicant: Sumitomo Electric Industries, Ltd., Osaka (JP)

(72) Inventor: Ken Kikuchi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 680 days.

(21) Appl. No.: 17/829,536

(22) Filed: Jun. 1, 2022

(65) Prior Publication Data

US 2022/0407467 A1 Dec. 22, 2022

(30) Foreign Application Priority Data

Jun. 21, 2021 (JP) .................. 2021-102587

(51) Int. Cl.
*H03F 1/02* (2006.01)
*H01L 23/66* (2006.01)
*H03F 3/195* (2006.01)

(52) U.S. Cl.
CPC ........... *H03F 1/0288* (2013.01); *H01L 23/66* (2013.01); *H03F 3/195* (2013.01); *H01L 2223/6611* (2013.01)

(58) Field of Classification Search
CPC ....... H03F 1/0288; H03F 3/195; H01L 23/66; H01L 2223/6611
USPC ....................................................... 330/295
See application file for complete search history.

(56) References Cited

U.S. PATENT DOCUMENTS

| | | | |
|---|---|---|---|
| 8,228,123 B2 | 7/2012 | Blednov | |
| 2011/0204980 A1* | 8/2011 | Blednov | H03F 3/195 330/295 |
| 2015/0145601 A1* | 5/2015 | Moronval | H03F 1/07 330/295 |
| 2021/0075374 A1* | 3/2021 | Wang | H03F 3/604 |
| 2022/0182472 A1* | 6/2022 | Tomita | H03F 1/07 |

FOREIGN PATENT DOCUMENTS

WO WO-2018142178 A1 * 8/2018 ............. H01L 23/66

* cited by examiner

*Primary Examiner* — Hafizur Rahman
(74) *Attorney, Agent, or Firm* — Volpe Koenig

(57) ABSTRACT

A Doherty amplifier includes a first amplifier that includes first output fingers and a first output electrode connected to the first output fingers, a second amplifier that includes second output fingers and a second output electrode connected to the second output fingers, a first bonding wire connected between a first region in the first output electrode and a second region in the second output electrode, a second bonding wire connected between a third region in the first output electrode and a fourth region in the second output electrode, and at least one of a first capacitor connected in series with the first bonding wire, and a second capacitor connected in parallel with the second bonding wire, wherein the first and the third regions are regions to which the first output fingers are connected, and the second and the fourth regions are regions to which second output fingers are connected.

9 Claims, 15 Drawing Sheets

DOHERTY AMPLIFIER

CROSS REFERENCE TO RELATED APPLICATIONS

This application claims priority based on Japanese Patent Application No. 2021-102587, filed on Jun. 21, 2021, and the entire contents of the Japanese patent applications are incorporated herein by reference.

FIELD

The present disclosure relates to a Doherty amplifier.

BACKGROUND

There has been known a Doherty amplifier as an amplifier that amplifies high-frequency signals such as microwaves. In the Doherty amplifier, a main amplifier and a peak amplifier amplify input signals in parallel, and the amplified signals is synthesized by a synthesizer. In the synthesizer, a quarter wavelength line is provided between the main amplifier and a synthesis point. It is known to use an output capacitance and a bonding wire in the main amplifier instead of the quarter wavelength line (for example, Patent Document 1: U.S. Pat. No. 8,228,123).

SUMMARY

A Doherty amplifier according to the present disclosure includes: a first amplifier that includes a plurality of first output fingers and a first output electrode connected to the plurality of first output fingers, amplifies one of two signals into which an input signal is distributed, and outputs an amplified signal to the first output electrode; a second amplifier that includes a plurality of second output fingers and a second output electrode connected to the plurality of second output fingers, amplifies another one of the two signals, and outputs an amplified signal to the second output electrode; a first bonding wire connected between a first region in the first output electrode and a second region in the second output electrode; a second bonding wire connected between a third region in the first output electrode closer to the second output electrode than the first region and a fourth region in the second output electrode closer to the first output electrode than the second region; and at least one of a first capacitor connected in series with the first bonding wire between the first region and the second region, and a second capacitor connected in parallel with the second bonding wire between the third region and the fourth region; wherein the first region and the third region are regions to which the plurality of first output fingers are connected, the second region and the fourth region are regions to which the plurality of second output fingers are connected, and the first amplifier and the second amplifier are arranged in a direction intersecting extension directions of the first output fingers and the second output fingers, respectively.

DETAILED DESCRIPTION OF EMBODIMENTS

Figure 1:
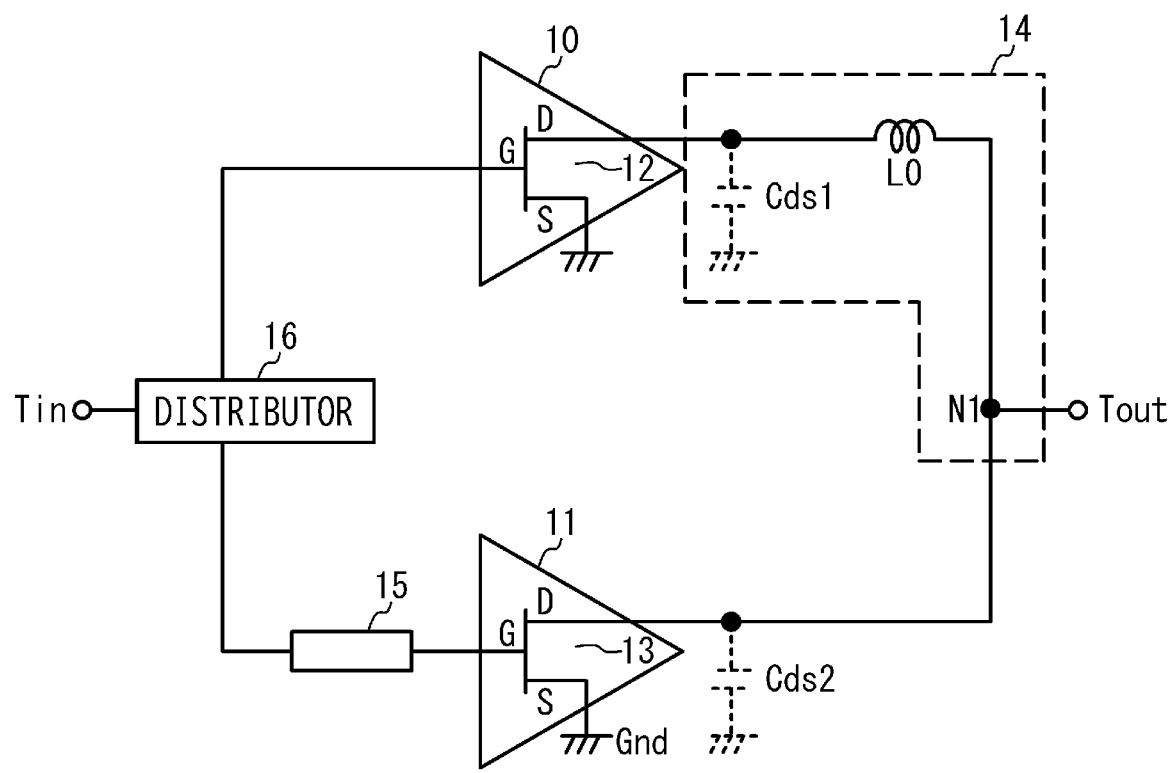
FIG. 1 is a block diagram of a Doherty amplifier according to a first embodiment.

The synthesizer may be formed by connecting an output electrode of the main amplifier to an output electrode of the peak amplifier using the bonding wire. However, when the output electrodes of the main amplifier and peak amplifier are wide, a plurality of bonding wires are connected between the output electrodes. In this case, electrical lengths between the main amplifier and the synthesis point via the plurality of bonding wires may differ from each other. This may deviate from the conditions of the ideal synthesizer and degrade the characteristics.

It is an object of the present disclosure to provide a Doherty amplifier that can improve characteristics.

DESCRIPTION OF EMBODIMENTS OF THE PRESENT DISCLOSURE

First, the contents of the embodiments of this disclosure are listed and explained.

(1) A Doherty amplifier according to the present disclosure includes: a first amplifier that includes a plurality of first output fingers and a first output electrode connected to the plurality of first output fingers, amplifies one of two signals into which an input signal is distributed, and outputs an amplified signal to the first output electrode; a second amplifier that includes a plurality of second output fingers and a second output electrode connected to the plurality of second output fingers, amplifies another one of the two signals, and outputs an amplified signal to the second output electrode; a first bonding wire connected between a first region in the first output electrode and a second region in the second output electrode; a second bonding wire connected between a third region in the first output electrode closer to the second output electrode than the first region and a fourth region in the second output electrode closer to the first output electrode than the second region; and at least one of a first capacitor connected in series with the first bonding wire between the first region and the second region, and a second capacitor connected in parallel with the second bonding wire between the third region and the fourth region; wherein the first region and the third region are regions to which the plurality of first output fingers are connected, the second region and the fourth region are regions to which the plurality of second output fingers are connected, and the first amplifier and the second amplifier are arranged in a direction intersecting extension directions of the first output fingers and the second output fingers, respectively. This makes it possible to improve the characteristics of the Doherty amplifier.

(2) The first output electrode may be separated between the first region and the third region, and the second output electrode may be separated between the second region and the fourth region.

(3) The first bonding wire may not intersect with the second bonding wire.

(4) The first region and the second region may be connected to each other without through the third region and the fourth region, and the third region and the fourth region may be connected to each other without through the first region and the second region.

(5) A signal output by the first amplifier and a signal output by the second amplifier may be synthesized in the second output electrode.

(6) The Doherty amplifier further may include a harmonic processing circuit that is connected to the second output electrode and processes a harmonic component of the signals amplified by the first amplifier and the second amplifier.

(7) A capacitor included in the Doherty amplifier may be the first capacitor.

(8) A capacitor included in the Doherty amplifier may be the second capacitor.

(9) Capacitors included in the Doherty amplifier may be the first capacitor and the second capacitor.

Details of Embodiments of the Present Disclosure

Specific examples of a Doherty amplifier in accordance with embodiments of the present disclosure are described below with reference to the drawings. The present disclosure is not limited to these examples, but is indicated by the claims, which are intended to include all modifications within the meaning and scope of the claims.

First Embodiment

FIG. 1 is a block diagram of a Doherty amplifier according to a first embodiment. As illustrated in FIG. 1, in the Doherty amplifier, a main amplifier 10 and a peak amplifier 11 are connected in parallel between an input terminal Tin and an output terminal Tout. A high frequency signal is input to the input terminal Tin as an input signal. A distributor 16 distributes the input signal into two signals. One of the distributed signals is input to the main amplifier 10. The main amplifier 10 (first amplifier) amplifies the input one of the distributed signals and outputs it to a synthesizer 14. The other signal distributed by the distributor 16 is input to the peak amplifier 11 via a quarter wavelength line 15. The synthesizer 14 synthesizes an output signal from the main amplifier 10 and an output signal from the peak amplifier 11, and outputs a synthesized signal to the output terminal Tout.

The main amplifier 10 and the peak amplifier 11 include, for example, FETs (Field Effect Transistors) 12 and 13, respectively. In the FETs 12 and 13, a source S is grounded, a high frequency signal is input to a gate G, and a signal is output from a drain D. The FETs 12 and 13 are, for example, a GaN FET or an LDMOS (Laterally Diffused Metal Oxide Semiconductor). The main amplifier 10 and the peak amplifier 11 may be provided with multi-stage FETs 12 and 13, respectively. The FETs 12 and 13 have drain source capacities Cds1 and Cds2, respectively. The drain source capacitances Cds1 and Cds2 are internal capacitances of the FETs 12 and 13, but are described by using dotted lines in FIG. 1. The synthesizer 14 includes a drain source capacitance Cds1 of the main amplifier 10, an inductor L0, and a synthesis point N1. The drain source capacitance Cds1 and the inductor L0 function as an impedance inverter at a center frequency in a band of the Doherty amplifier and are used instead of the quarter wavelength line. At the synthesis point N1, the signal amplified by the main amplifier 10 and the signal amplified by the peak amplifier 11 are synthesized.

The main amplifier 10 operates in class AB or class B, and the peak amplifier 11 operates in class C. Thereby, when an input power is small, the main amplifier 10 mainly amplifies the input signal. When the input power becomes large, the main amplifier 10 and the peak amplifier 11 amplify the input signal. Matching circuits may be connected between the distributor 16 and the main amplifier 10, between the distributor 16 and the peak amplifier 11, and between the synthesizer 14 and the output terminal Tout. When the peak amplifier 11 operates in a state where the input power of the high frequency signal input to the input terminal Tin is large, the main amplifier 10 and the peak amplifier 11 are set to operate optimally at a saturation power (for example, the efficiency is maximized). When the peak amplifier 11 does not operate in a state where the input power is small, the main amplifier 10 is set to operate optimally (for example, efficiency is maximized) at the saturation power.

Figure 2:
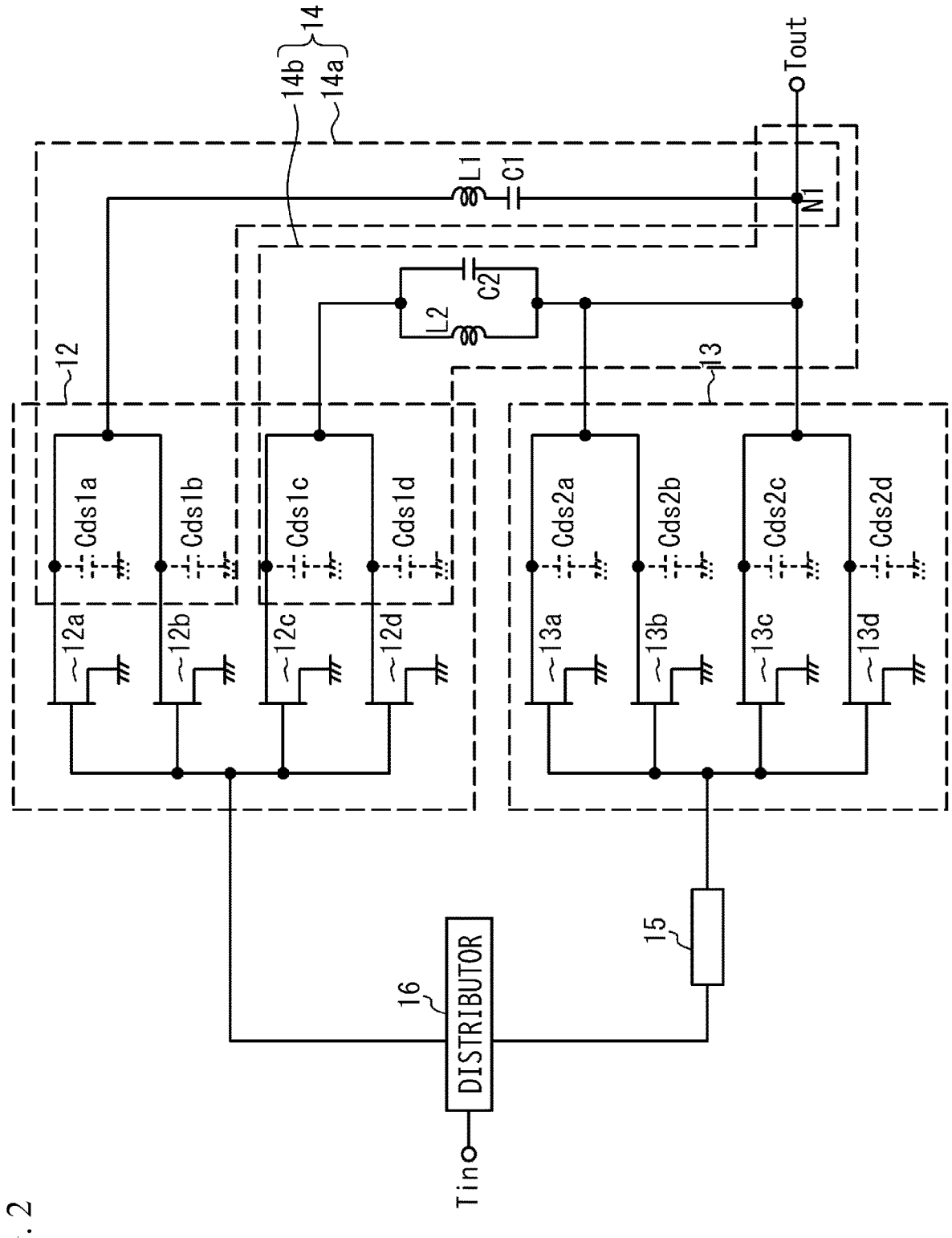
FIG. 2 is a circuit diagram of the Doherty amplifier according to the first embodiment.

FIG. 2 is a circuit diagram of the Doherty amplifier according to the first embodiment. As illustrated in FIG. 2, in the FET 12, a plurality of FETs 12a to 12d are connected in parallel, and in the FET 13, a plurality of FETs 13a to 13d are connected in parallel. The FETs 12 and 13 are multi-finger FETs, and the FETs 12a to 12d and the FETs 13a to 13d are schematically representations of multi-finger FETs. The FETs 12a to 12d and the FETs 13a to 13d have drain source capacities Cds1a to Cds1d and Cds2a to Cds2d, respectively.

An inductor L1 and a capacitor C1 (first capacitor) are connected in series between the drains of the FETs 12a and 12b and the drains of the FETs 13c and 13d. An inductor L2 and a capacitor C2 (second capacitor) are connected in parallel between the drains of the FETs 12c and 12d and the drains of the FETs 13a and 13b. The drain source capacitances Cds1a and Cds1b of the FETs 12a and 12b, the inductor L1 and the capacitor C1 form a synthesizer 14a. The drain source capacitances Cds1c and Cds1d of the FETs 12c and 12d, the inductor L2 and the capacitor C2 form a synthesizer 14b.

Figure 3:
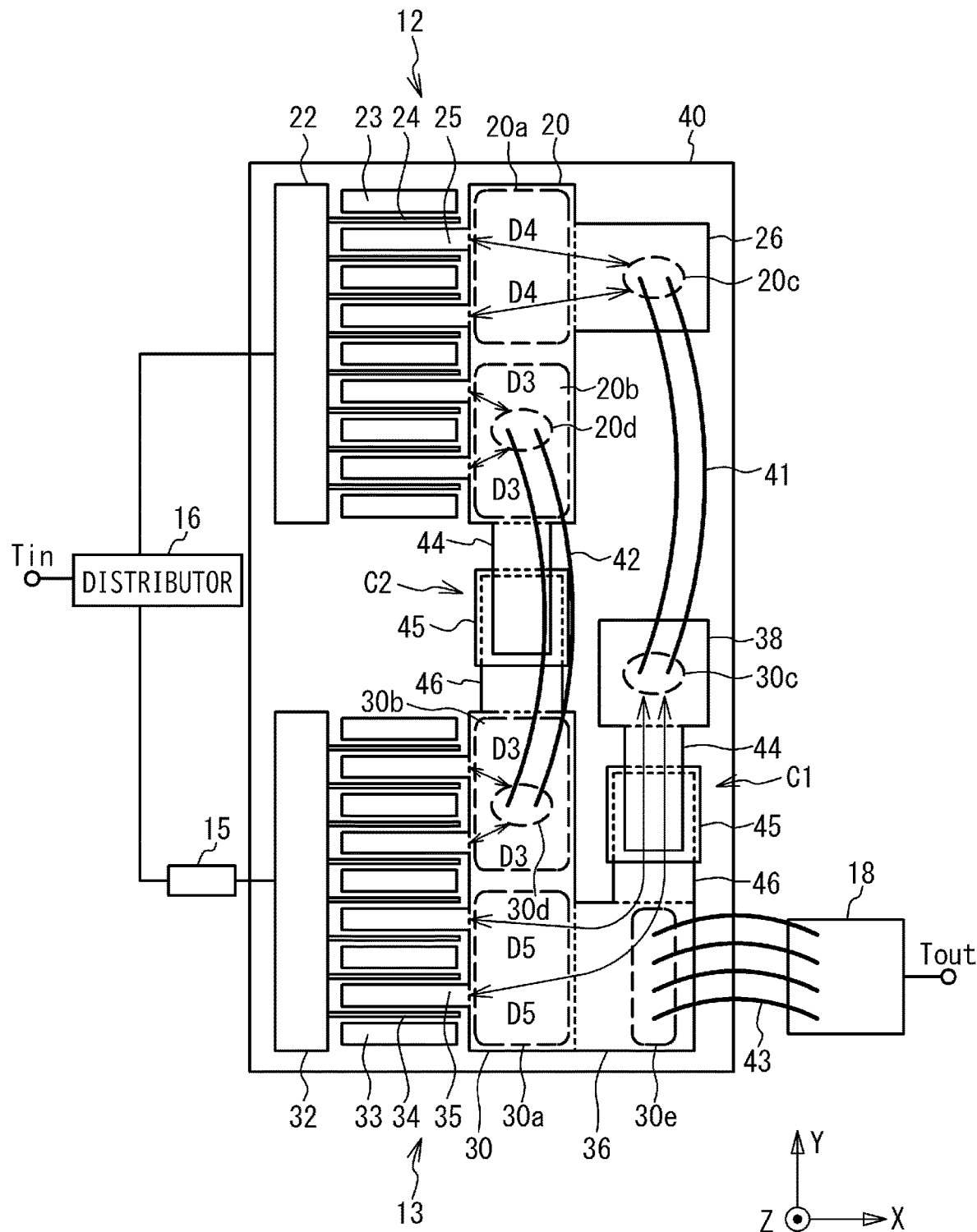
FIG. 3 is a plan view of the Doherty amplifier according to the first embodiment.

FIG. 3 is a plan view of the Doherty amplifier according to the first embodiment. As illustrated in FIG. 3, the FETs 12 and 13 are provided on a semiconductor chip 40 and are arranged in a Y direction. The FET 12 is a multi-finger FET having a plurality of source fingers 23, a plurality of gate fingers 24, and a plurality of drain fingers 25. The source fingers 23, the gate fingers 24 and the drain fingers 25 extend in an X direction. The plurality of drain fingers 25 are connected to a drain electrode 20. The plurality of gate fingers 24 are connected to a gate electrode 22. The source fingers 23 are connected to a ground on a lower surface of the semiconductor chip 40 by via holes. The FET 13 includes a plurality of source fingers 33, a plurality of gate fingers 34, a plurality of drain fingers 35, a drain electrode 30, and a gate electrode 32. The configurations of the source fingers 33, the gate fingers 34, the drain fingers 35, the drain electrode 30, and the gate electrode 32 in the FET 13 are the same as those in the FET 12, and the description thereof will be omitted. Since the source fingers 23 and 33, the gate fingers 24 and 34, and the drain fingers 25 and 35 are arranged in the Y direction, the drain electrodes 20 and 30 and the gate electrodes 22 and 32 are widened in the Y direction.

In the drain electrode 20 of the FET 12, a region far from the drain electrode 30 of the FET 13 is a first region 20a, and a region close to the drain electrode 30 is a third region 20b. In the drain electrode 30 of the FET 13, a region far from the drain electrode 20 of the FET 12 is a second region 30a, and a region close to the drain electrode 20 is a fourth region 30b.

A pad 26 connected to the region 20a is provided on a +X side of the region 20a. A pad 36 connected to the region 30a is provided on the +X side of the region 30a. A pad 38 is provided in a +Y side of the pad 36. The capacitor C1 is connected between the pads 36 and 38. The pads 26 and 38 are connected by bonding wires 41. Regions where the bonding wires 41 bond to the pads 26 and 38 are regions 20c and 30c, respectively. The regions 20a and 30a are connected to each other via the pad 26, the bonding wires 41, the pad 38, the capacitor C1 and the pad 36. Distances D4 (electrical length) between the region 20c and the plurality of drain fingers 25 connected to the region 20a are substantially the same as each other. Distances D5 between the region 30c and the plurality of drain fingers 35 connected to the region 30a are substantially the same as each other.

The regions 20b and 30b are connected by bonding wires 42. Regions where the bonding wires 42 bond to the drain electrodes 20 and 30 are regions 20d and 30d, respectively. The capacitor C2 is connected in parallel with the bonding wires 42 between the regions 20d and 30d. Distances D3 between the region 20d and the plurality of drain fingers 25 connected to the region 20b are substantially the same as each other. Another distances D3 between the region 30d and the plurality of drain fingers 35 connected to the region 30b are substantially the same as each other.

Each of the capacitors C1 and C2 is a MIM (Metal Insulator Metal) capacitor having an upper electrode 44, a lower electrode 46, and a dielectric film 45. The drain electrode 30 is connected to a matching circuit 18 via bonding wires 43. A region where the bonding wires 43 bond to the drain electrode 30 is a region 30e. The matching circuit 18 is connected to the output terminal Tout. The drain electrodes 20, 30, the gate electrodes 22, 32, the pads 26, 36 and 38, the upper electrode 44, and the lower electrode 46 are metal layers such as a gold layer. Bonding wires are connected between the distributor 16 and the gate electrode 22 and between the quarter wavelength line 15 and the gate electrode 32, but the illustration of the bonding wires is omitted.

Figure 4:
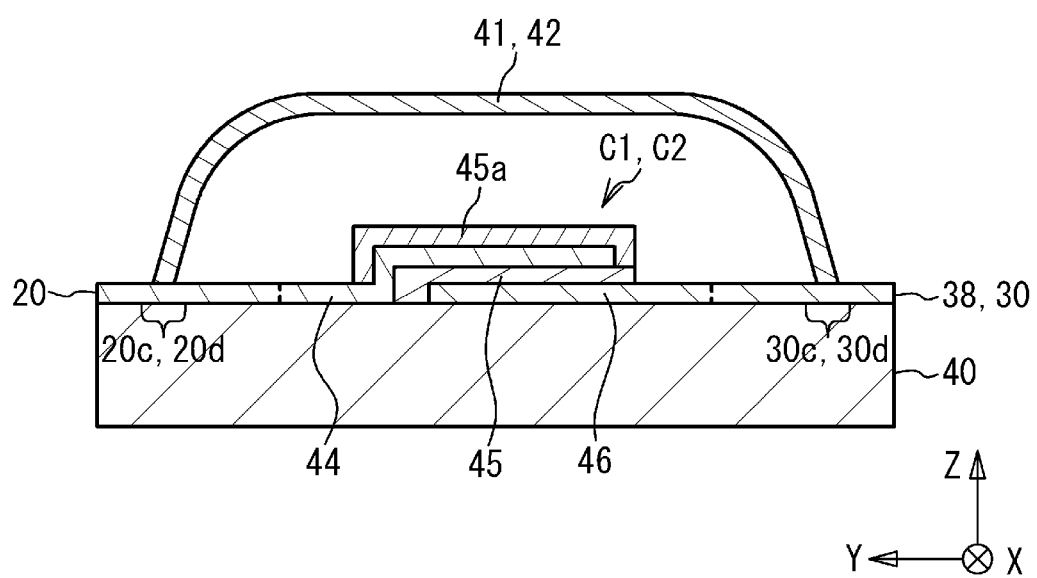
FIG. 4 is a cross-sectional view of a capacitor in the first embodiment.

FIG. 4 is a cross-sectional view of the capacitor in the first embodiment. As illustrated in FIG. 4, the drain electrode 20 and the pad 38 (and the drain electrode 30) are provided on the semiconductor chip 40. The drain electrode 20 is connected to the upper electrode 44, and the pad 38 (and the drain electrode 30) is connected to the lower electrode 46. In the capacitor C1 (and C2), the dielectric film 45 is provided between the upper electrode 44 and the lower electrode 46. The dielectric film 45 is an inorganic dielectric film such as a silicon nitride film or a silicon oxide film. An insulating film 45a is provided so as to cover the upper electrode 44. Both ends of the bonding wire 41 (and 42) are bonded to the regions 20c (and 20d) and the regions 30c (and 30d). The drain electrode 20 may be connected to the lower electrode 46 and the pad 38 (and the drain electrode 30) may be connected to the upper electrode 44.

First Comparative Example

Figure 5:
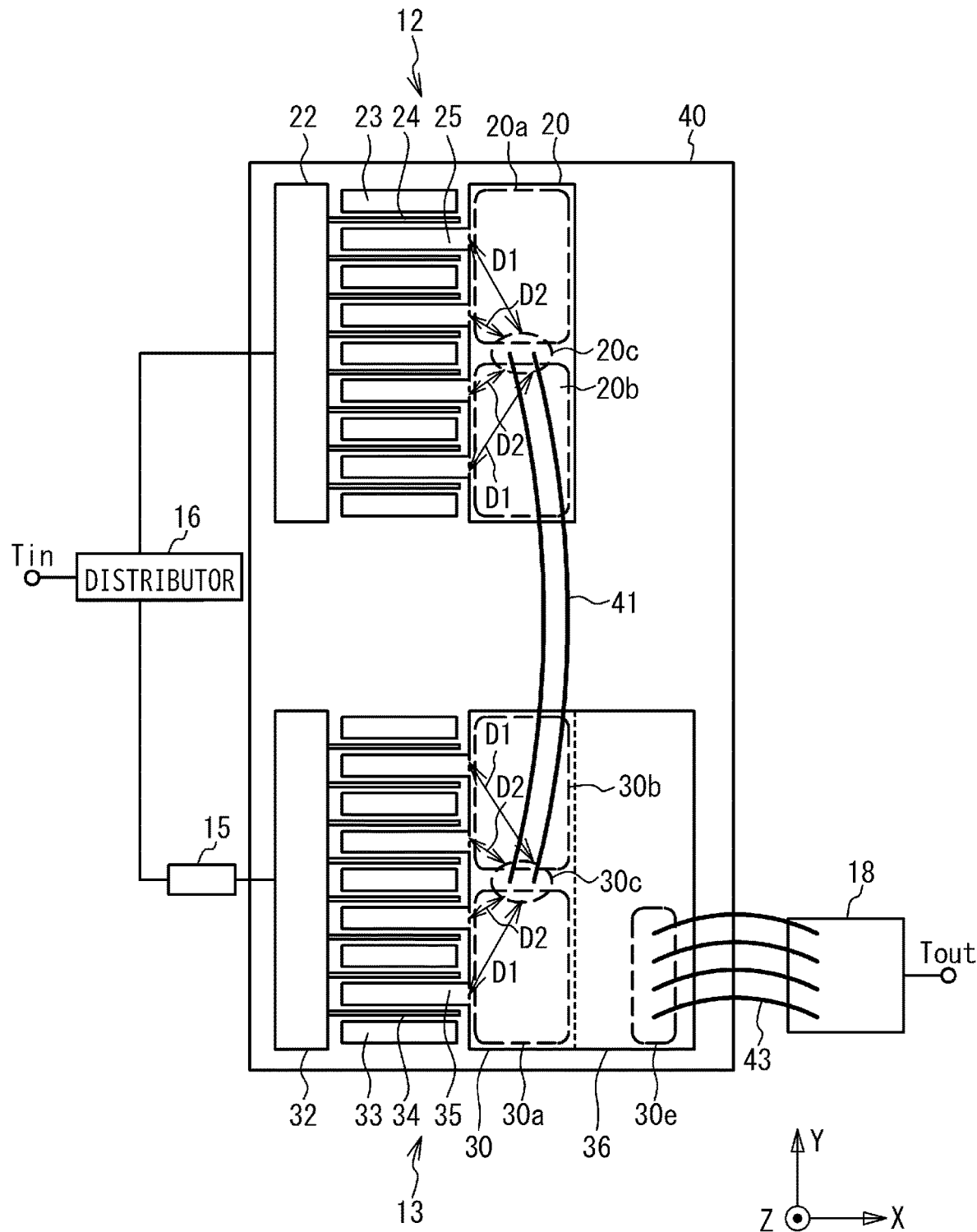
FIG. 5 is a plan view of a Doherty amplifier in a first comparative example.

FIG. 5 is a plan view of a Doherty amplifier in a first comparative example. As illustrated in FIG. 5, in the first comparative example, the capacitors C1 and C2 are not provided. The regions 20c and 30c to which the bonding wires 41 are bonded are between the regions 20a and 20b and between the regions 30a and 30b, respectively. The bonding wires 42 are not provided. Other configurations are the same as those in the first embodiment.

In the first comparative example, the phases of the signals are almost the same at points where the plurality of drain fingers 25 (and 35) are connected to the drain electrodes 20 (and 30). The distance D1 between the regions 20c (and 30c) and the drain fingers 25 (and 35) far from the regions 20c (and 30c) is longer than the distance D2 between the regions 20c (and 30c) and the drain fingers 25 (and 35) close to the regions 20c (and 30c). Thereby, the phases of the signals output from the drain fingers 25 (and 35) to be synthesized in the regions 20c (and 30c) are different from each other. Therefore, the loss increases.

Second Comparative Example

Figure 6:
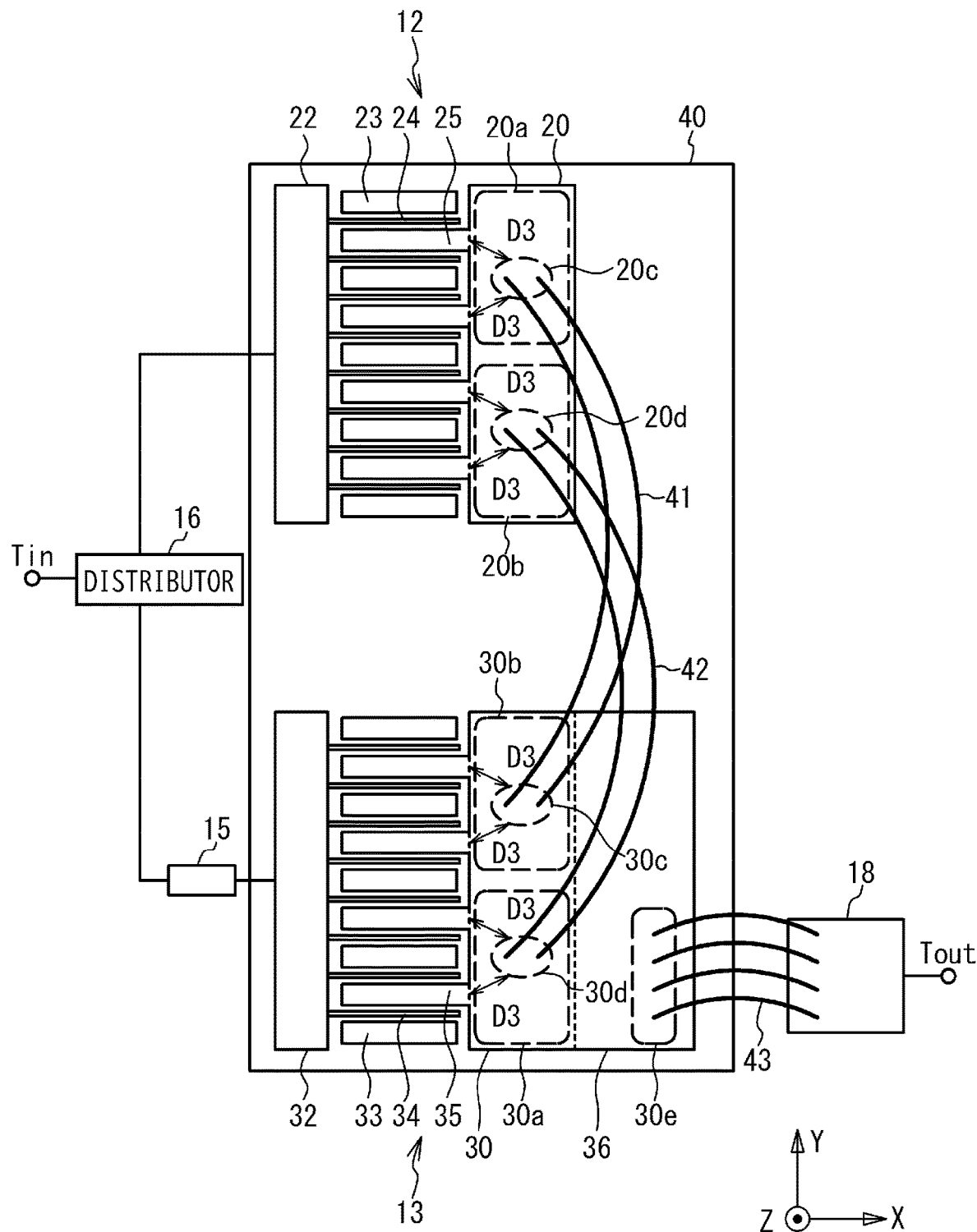
FIG. 6 is a plan view of a Doherty amplifier in a second comparative example.

FIG. 6 is a plan view of a Doherty amplifier in a second comparative example. As illustrated in FIG. 6, the bonding wires 41 and 42 are provided. The regions 20c and 30c to which the bonding wires 41 are bonded are provided in the regions 20a and 30b, respectively. The regions 20d and 30d to which the bonding wires 42 are bonded are provided in the regions 20b and 30b, respectively. A reason why the bonding wires 41 connect the regions 20c and 30c and the bonding wires 42 connect the regions 20d and 30d is to make the lengths of the bonding wires 41 and 42 the same and make the respective inductances the same, which prevents the phases of the signals flowing through the bonding wires 41 and 42 from deviating from each other. Other configurations are the same as those in the first comparative example.

In the second comparative example, the regions 20c and 20d (or 30a and 30b) are provided near the centers of the regions 20a and 20b (or 30c and 30d). Therefore, the distances D3 between the drain finger 25 (or 35) and the regions 20c and 20d (or 30c and 30d) are almost the same as each other. Therefore, the phases of the signals output from the drain fingers 25 (or 35) to be synthesized in the regions 20c and 20d (or 30c and 30d) are almost the same as each other. Thereby, the loss can be suppressed. Although the example in which the regions 20a and 20b (or 30a and 30b) are provided for two drain fingers 25 (or 35) is described, the regions 20a and 20b (or 30a and 30b) may be provided for three drain fingers 25 (or 35). Even in that case, the phases of the signals synthesized in the regions 20c and 20d (or 30c and 30d) can be aligned in the second comparative example, as compared with the first comparative example. However, in the second comparative example, in order to align the lengths of the bonding wires 41 and 42 to be the same, the bonding wires 41 and 42 are connected so as to intersect each other. However, due to the proximity effect, the resistance values of the bonding wires 41 and 42 increase, and the Q values of the bonding wires 41 and 42 (that is, the inductors L1 and L2) decrease.

Third Comparative Example

Figure 7:
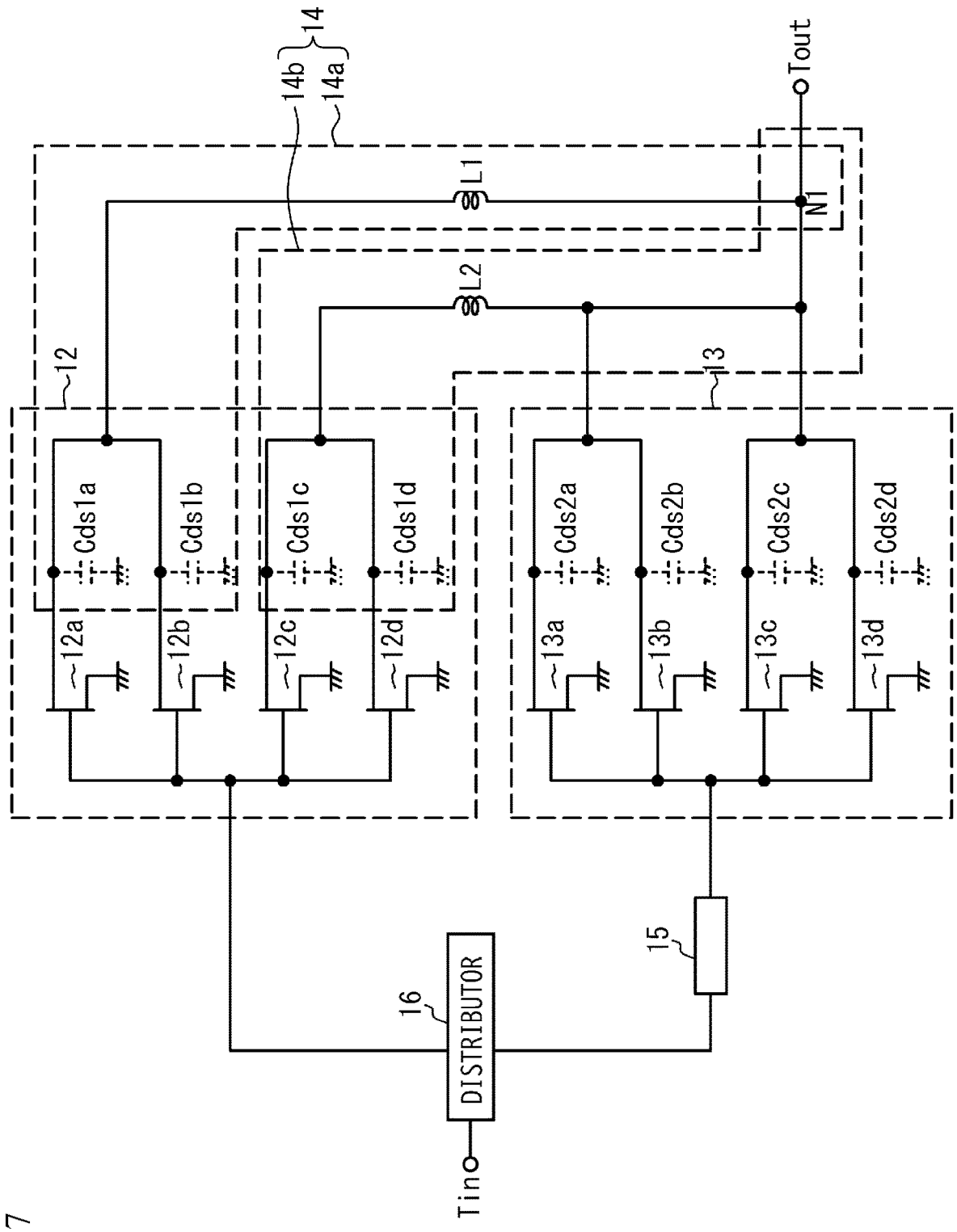
FIG. 7 is a circuit diagram of a Doherty amplifier in a third comparative example.
Figure 8:
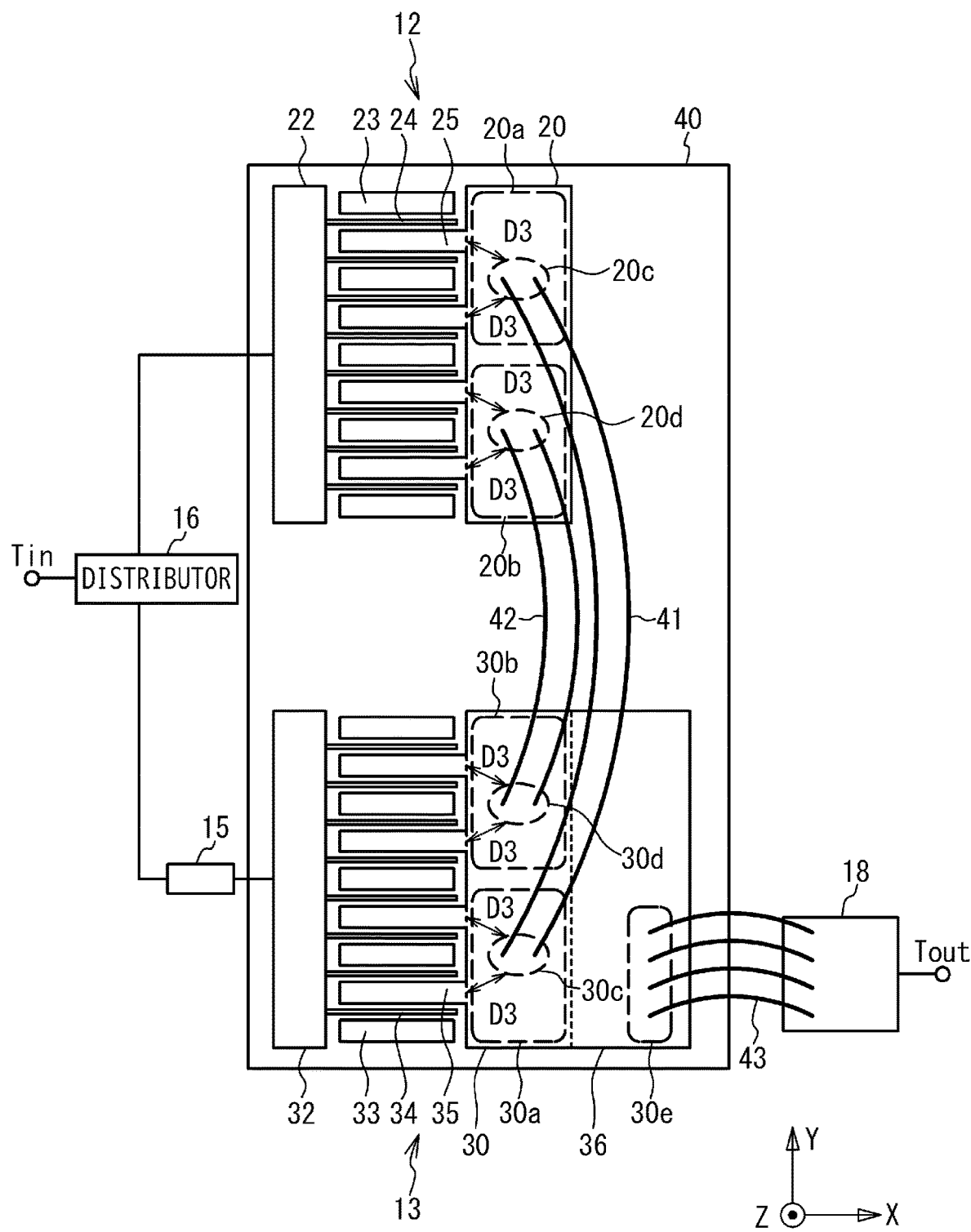
FIG. 8 is a plan view of the Doherty amplifier in the third comparative example.

FIG. 7 is a circuit diagram of a Doherty amplifier in a third comparative example. FIG. 8 is a plan view of the Doherty amplifier in the third comparative example. As illustrated in FIGS. 7 and 8, in the third comparative example, the regions 20c and 30c to which the bonding wires 41 are bonded are provided in the regions 20a and 30a, respectively. The regions 20d and 30d to which the bonding wires 42 are bonded are provided in the regions 20b and 30b, respectively. The bonding wires 41 and 42 correspond to the inductors L1 and L2, respectively. Other configurations are the same as those in the second comparative example.

The distances D3 between the drain finger 25 and the regions 20c and 20d are almost the same as each other. Thereby, the phases of the signals in the regions 20c and 20d are almost aligned. Similarly, the distances D3 between the drain finger 35 and the regions 30c and 30d are almost the same each other, and the phases of the signals in regions 30c and 30d are almost aligned. However, the lengths of the bonding wires 41 and 42 are different from each other, and the inductances of inductors L1 and L2 are different from each other. Further, the electric length from the region 20a to the region 30e via the bonding wires 41 and the region 30a are different from the electric length from the region 20b to the region 30e via the bonding wires 42 and the region 30b. This makes it difficult to set both of the synthesizers 14a and 14b to have an electrical length of the quarter wavelength at the center frequency of the band. Even if the lengths of the bonding wires 41 and 42 are about the same as each other, the electrical length between the region 20a and the synthesis point N1 and the electrical length between the region 20b and the synthesis point N1 are different from each other.

According to the first embodiment, as illustrated in FIG. 3, the bonding wires 41 (first bonding wire) are connected between the region 20a (first region) in the drain electrode 20 (first output electrode) and the region 30a (second region) in the drain electrode 30 (second output electrode). The bonding wires 42 (second bonding wire) are connected between the region 20b (third region) different from the region 20a in the drain electrode 20 and the region 30b (fourth region) different from the region 30a in the drain electrode 30. In this way, when the different regions 20a and 20b in the drain electrode 20 are connected to the different regions 30a and 30b in the drain electrode 30, respectively, the electrical lengths of the synthesizers 14a and 14b are different from each other, and the characteristics of the Dougherty amplifier are deteriorated. Therefore, the capacitor C1 (first capacitor) connected in series or in parallel with the bonding wires 41 is provided between the regions 20a and 30a. The capacitor C2 (second capacitor) connected in series or in parallel with the bonding wires 42 is provided between the regions 20b and 30b. Thereby, the electric lengths of the synthesizers 14a and 14b can be made substantially the same. Therefore, the deterioration of the characteristics of the Doherty amplifier can be suppressed.

The region 20b is closer to the drain electrode 30 than the region 20a, and the region 30b is closer to the drain electrode 20 than the region 30a. At this time, the distance between the region 20a and the synthesis point N1 is longer than the distance between the region 20b and the synthesis point N1. For this reason, the capacitor C1 is connected in series with the bonding wires 41 between the regions 20a and the regions 30a. The capacitor C2 is connected in parallel with the bonding wires 42 between the regions 20b and the regions 30b. Thereby, a total electrical length of the connection between the region 20a and the synthesis point N1 via the series connection of the bonding wires 41 and the capacitor C1 can be substantially shorter than the total electrical length in the case where the capacitor C1 is not included between the region 20a and the synthesis point N1.

The total electrical length of the connection between the region 20b and the synthesis point N1 via the parallel connection of the bonding wires 42 and capacitor C2 can be substantially longer than the total electrical length in the case where the capacitor C2 is not included. Therefore, the electrical length between the region 20a and the synthesis point N1 and the electrical length between the region 20b and the synthesis point N1 can be almost the same as each other.

The main amplifier 10 includes the plurality of drain fingers 25 (first output fingers), and the regions 20a and 20b are regions to which the plurality of drain fingers 25 are connected. Further, the peak amplifier 11 includes the plurality of drain fingers 35 (second output fingers), and the regions 30a and 30b are regions to which the plurality of drain fingers 35 are connected. In such multi-finger FETs, the phases are substantially the same as each other in the regions 20a and 20b to which the drain fingers 25 are connected. Therefore, when the electrical length between the region 20a and the synthesis point N1 is different from the electrical length between the region 20b and the synthesis point N1, the characteristics of the Doherty amplifier deteriorate. Therefore, it is preferable to provide capacitors C1 and C2.

In the multi-finger FET, the widths of the drain electrodes 20 and 30 in a direction intersecting the extension direction (X direction) of the drain fingers 25 and 35 are widened. Therefore, when the main amplifier 10 and the peak amplifier 11 are arranged in the direction intersecting the extension direction of the drain fingers 25 and the drain fingers 35, respectively, the electrical length between the region 20a and the synthesis point N1 and the electrical length between the region 20b and the synthesis point N1 easily differ from each other. Therefore, it is preferable to provide capacitors C1 and C2.

The regions 20d and 30d to which the bonding wires 42 are bonded are provided in the regions 20b and 30b, respectively. On the other hand, the pads 26 and 36 for pulling out the regions 20a and 30a in the +X direction are provided, respectively, and the bonding wires 41 are bonded in the regions 20c and 30c which are arranged in the +X direction from the regions 20a and 30a. Thereby, it is possible to prevent the bonding wires 41 and 42 from intersecting with each other. Therefore, it is possible to suppress a decrease in the Q value as illustrated in the second comparative example.

Further, the signal output by the main amplifier 10 and the signal output by the peak amplifier 11 are synthesized in the drain electrode 30. Thereby, a difference easily occurs between the electric length between the region 20a and the synthesis point N1 and the electric length between the region 20b and the synthesis point N1. Therefore, it is preferable to provide the capacitors C1 and C2.

When the regions 20a and 30a are connected to each other via the region 20b, the signal from the drain finger 25 connected to the region 20a and the signal from the drain finger 25 connected to the region 20b are synthesized in the region 20b. Thereby, the signals having different phases are synthesized and the loss occurs. Similarly, when the regions 20a and 30a are connected to each other via the region 30b, the signals having different phases are synthesized in the region 30b and the loss occurs. According to the first embodiment, the regions 20a and 30a are connected to each other without through the regions 20b and 30b, and the regions 20b and 30b are connected to each other without through the regions 20a and 30a. Thereby, the loss can be suppressed.

First Variation of First Embodiment

Figure 9:
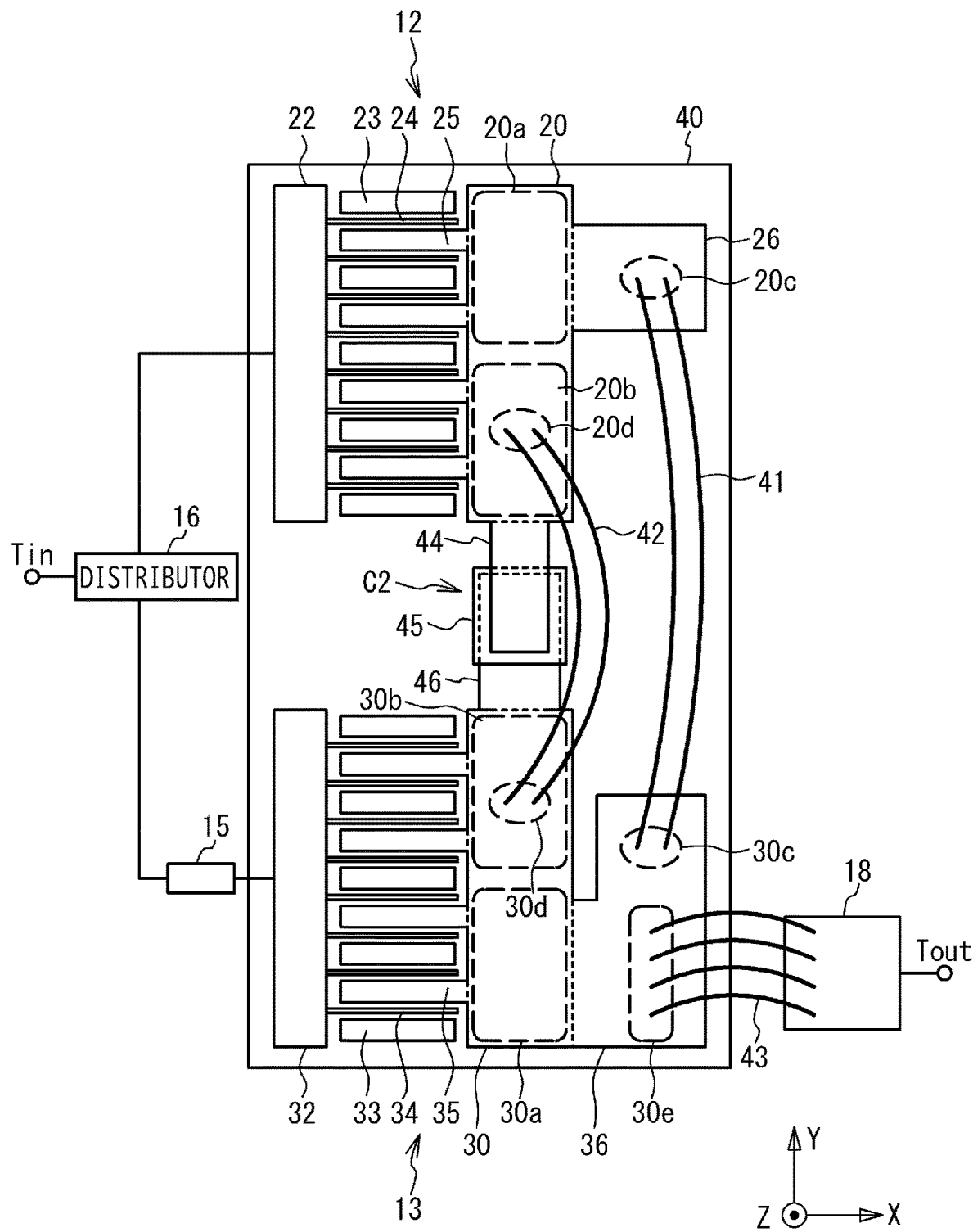
FIG. 9 is a plan view of a Doherty amplifier in a first variation of the first embodiment.

FIG. 9 is a plan view of a Doherty amplifier in a first variation of the first embodiment. As illustrated in FIG. 9, the pad 36 is pulled out from the region 30a in the +X direction and further bent in the +Y direction. The region 30c to which the bonding wire 41 is bonded is provided on the pad 36. The capacitor C1 is not connected in series or in parallel with the bonding wire 41 between the regions 20a and 30a. The capacitor C2 is connected in parallel with the bonding wires 42 between the regions 20b and 30b. Other configurations are the same as those in the first embodiment, and the description thereof will be omitted. Only the capacitor C2 among the capacitors C1 and C2 may be provided as in the first variation of the first embodiment.

Second Variation of First Embodiment

Figure 10:
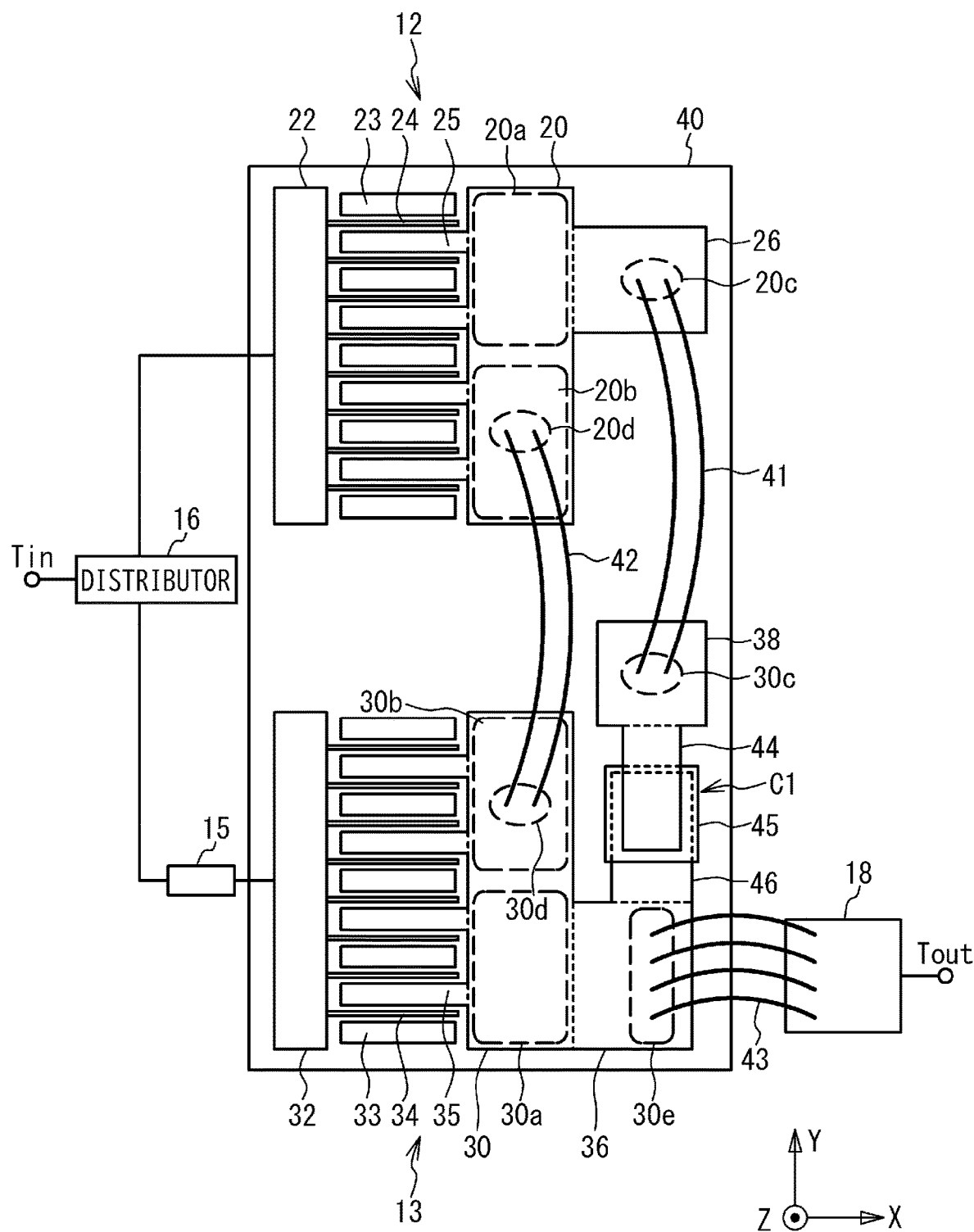
FIG. 10 is a plan view of a Doherty amplifier in a second variation of the first embodiment.

FIG. 10 is a plan view of a Doherty amplifier in a second variation of the first embodiment. As illustrated in FIG. 10, the capacitor C1 is connected in series with the bonding wires 41 between the regions 20a and 30a. The capacitor C2 is not connected in series or in parallel with the bonding wires 42 between the regions 20b and 30b. Other configurations are the same as those in the first embodiment, and the description thereof will be omitted. Only the capacitor C1 among the capacitors C1 and C2 may be provided as in the second variation of the first embodiment.

At least one of the capacitors C1 and C2 may be provided as in the first embodiment and the first and second variations thereof. Whether both of the capacitors C1 and C2 are provided or any one of the capacitors C1 and C2 are provided can be appropriately designed so that the electrical length between the region 20a and the synthesis point N1 is almost the same as the electrical length between the region 20b and the synthesis point N1.

Although the example in which the FETs 12 and 13 are provided on the same semiconductor chip 40 is described, the FETs 12 and 13 may be provided on different semiconductor chips. Although the example in which the main amplifier 10 and the peak amplifier 11 include the FETs 12 and 13, respectively, is described, the main amplifier 10 and the peak amplifier 11 may include transistors other than the FETs. Although the example of using the MIM capacitors as the capacitors C1 and C2 is described, capacitors other than the MIM capacitors may be used.

An example in which the drain electrode 20 is set to the two regions 20a and 20b and the drain electrode 30 is set to the two regions 30a and 30b is described. However, the drain electrode 20 may be set to three or more regions and the drain electrode 30 may be set to three or more regions. For example, the region between the regions 20a and 20b in the drain electrode 20 and the region between the regions 30a and 30b in the drain electrode 30 may be connected by bonding wires other than the bonding wires 41 and 42.

Although the examples of the main amplifier 10 and the peak amplifier 11 are described as the first amplifier and the second amplifier, respectively, the first amplifier and the second amplifier may be the peak amplifier 11 and the main amplifier 10, respectively.

Second Embodiment

Figure 11:
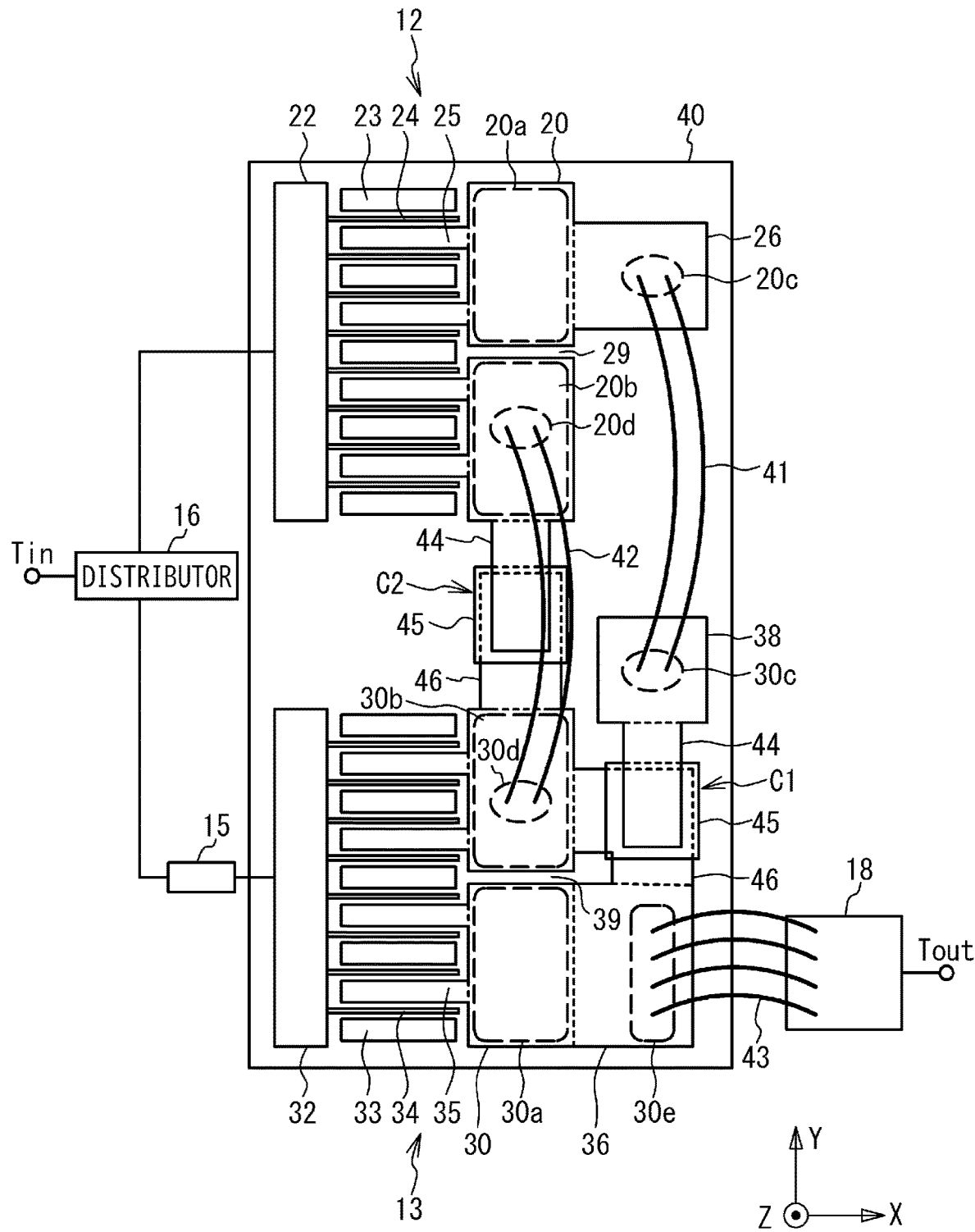
FIG. 11 is a plan view of a Doherty amplifier in a second embodiment.

FIG. 11 is a plan view of a Doherty amplifier in a second embodiment.

As illustrated in FIG. 11, the regions 20a and 20b in the drain electrode 20 are divided by a division region 29. The regions 30a and 30b in the drain electrode 30 are divided by a division region 39. The region 30b and the pad 36 are electrically connected to each other via the lower electrode 46 of the capacitor C1 and without via the region 30a. Other configurations are the same as those in the first embodiment, and the description thereof will be omitted.

First Variation of Second Embodiment

Figure 12:
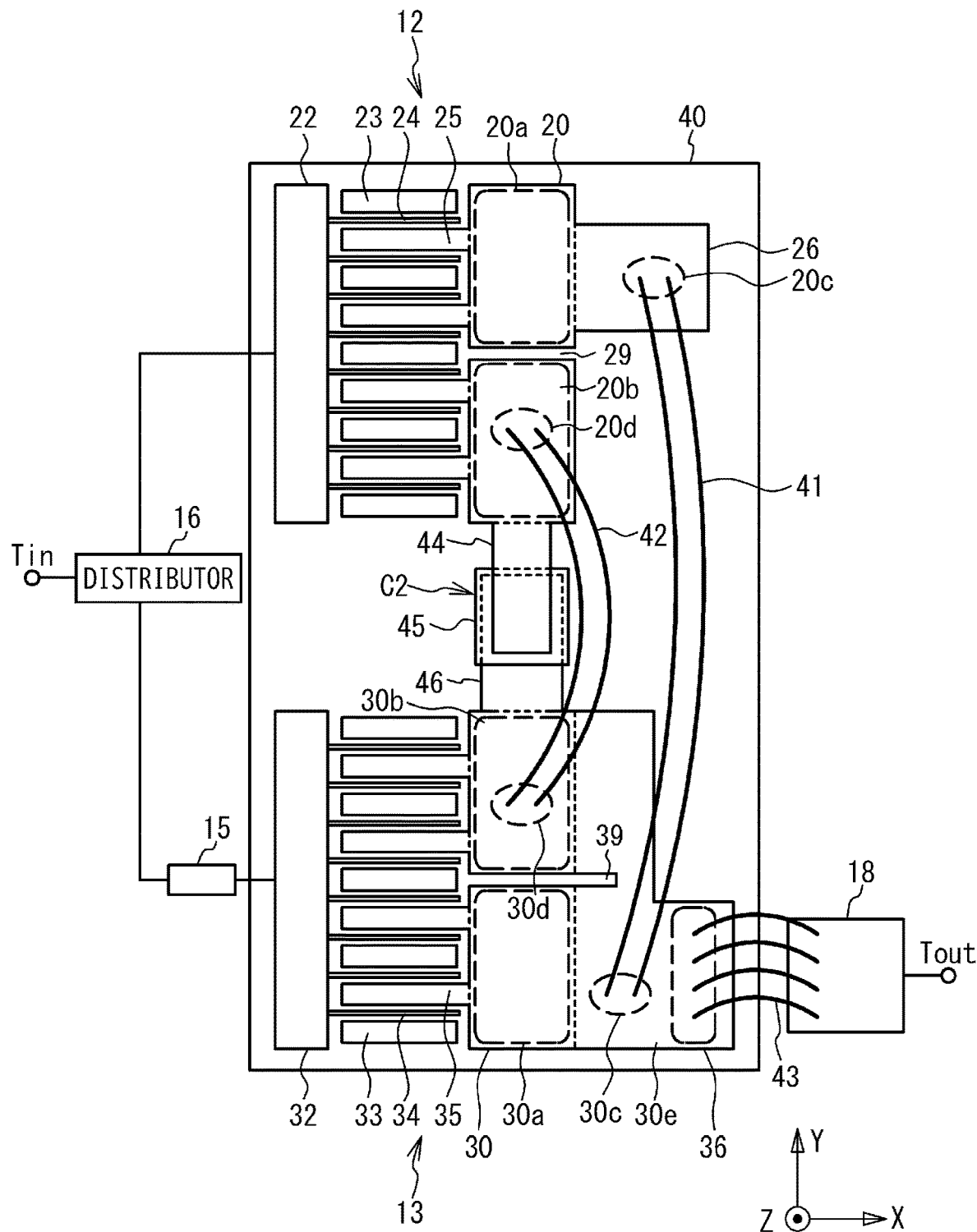
FIG. 12 is a plan view of a Doherty amplifier in a first variation of the second embodiment.

FIG. 12 is a plan view of a Doherty amplifier in a first variation of the second embodiment. As illustrated in FIG. 12, the capacitor C1 is not connected in series or in parallel with the bonding wires 41 between the regions 20a and 30a. The division regions 29 and 39 in the drain electrodes 20 and 30 are provided. The regions 30a and 30b are not directly connected to each other, but are connected to each other via the pad 36. The capacitor C2 is connected in parallel with the bonding wires 42 between the regions 20b and 30b. Other configurations are the same as those in the second embodiment, and the description thereof will be omitted. Only the capacitor C2 among the capacitors C1 and C2 may be provided as in the first variation of the second embodiment.

Second Variation of Second Embodiment

Figure 13:
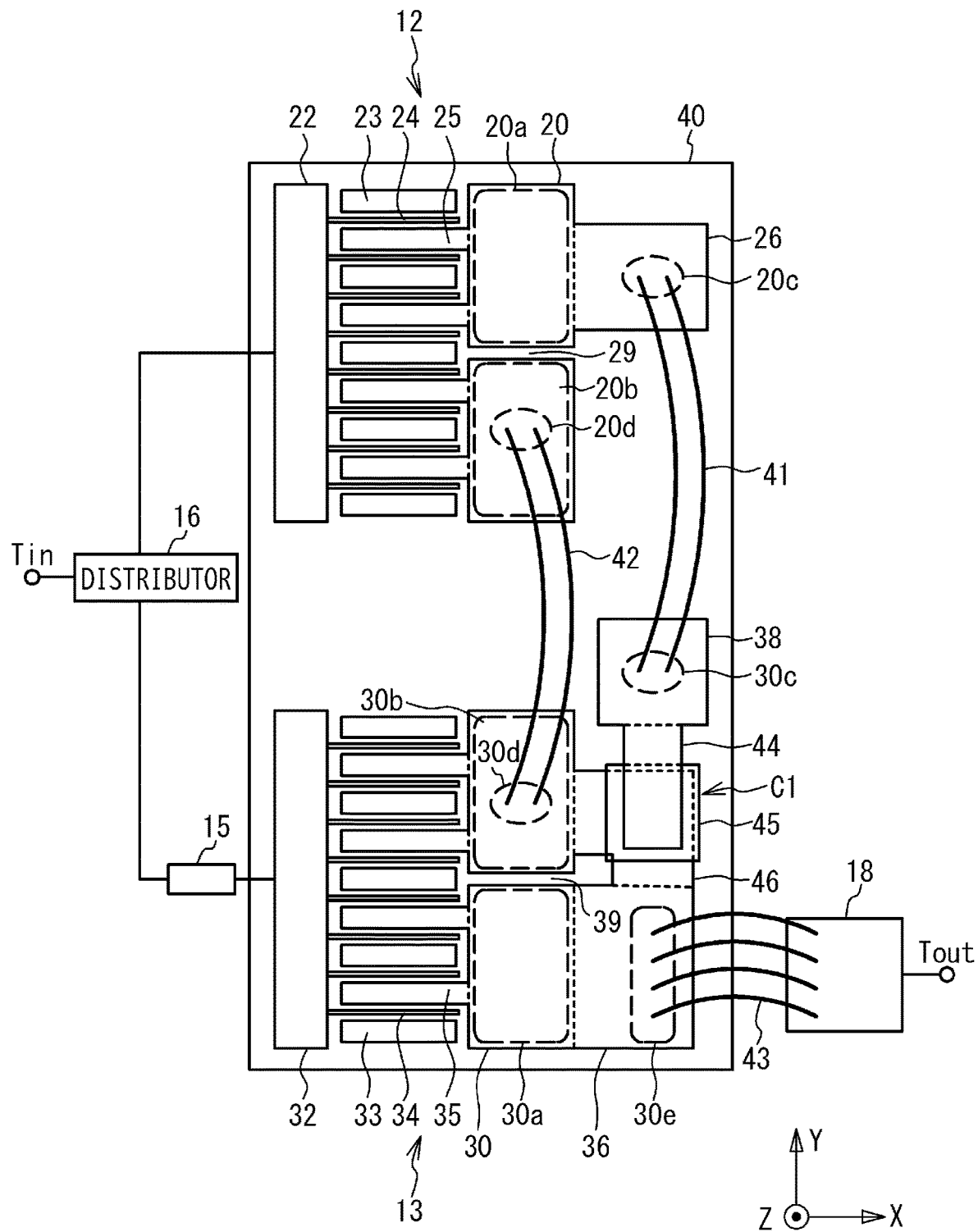
FIG. 13 is a plan view of a Doherty amplifier in a second variation of the second embodiment.

FIG. 13 is a plan view of a Doherty amplifier in a second variation of the second embodiment. As illustrated in FIG. 13, the capacitor C1 is connected in series with the bonding wires 41 between the regions 20a and 30a. The capacitor C2 is not connected in series or in parallel with the bonding wires 42 between the regions 20b and 30b. Other configurations are the same as those in the second embodiment, and the description thereof will be omitted. Only the capacitor C1 among the capacitors C1 and C2 may be provided as in the second variation of the second embodiment.

When the regions 20a and 20b are connected and the regions 30a and 30b are connected as in the first embodiment and the variations thereof, the characteristics are improved, but oscillation is likely to occur. Therefore, the regions 20a and 20b are separated and the regions 30a and 30b are separated as in the second embodiment and the variations thereof. Thereby, the oscillation can be suppressed.

Third Embodiment

Figure 14:
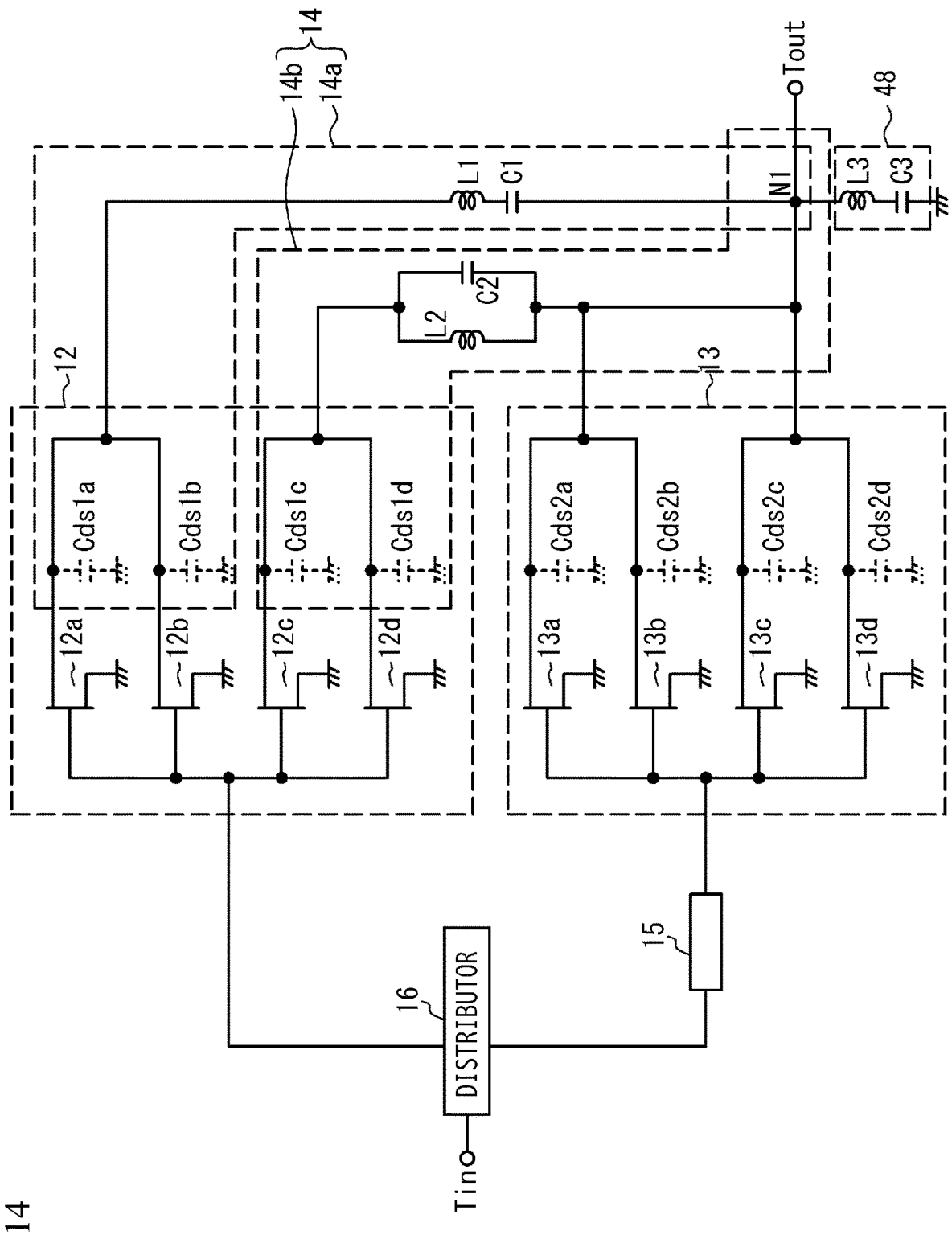
FIG. 14 is a circuit diagram of a Doherty amplifier in a third embodiment.

FIG. 14 is a circuit diagram of a Doherty amplifier in a third embodiment. As illustrated in FIG. 14, a harmonic processing circuit 48 is connected between the synthesis point N1 and the ground. The harmonic processing circuit 48 includes an inductor L3 and a capacitor C3 that are connected in series between the synthesis point N1 and the ground. The inductor L3 and the capacitor C3 form a series resonant circuit and have a resonant frequency in a harmonic frequency band in a band of the Doherty amplifier. Other circuit configurations are the same as those in FIG. 2 of the second embodiment, and the description thereof will be omitted.

Figure 15:
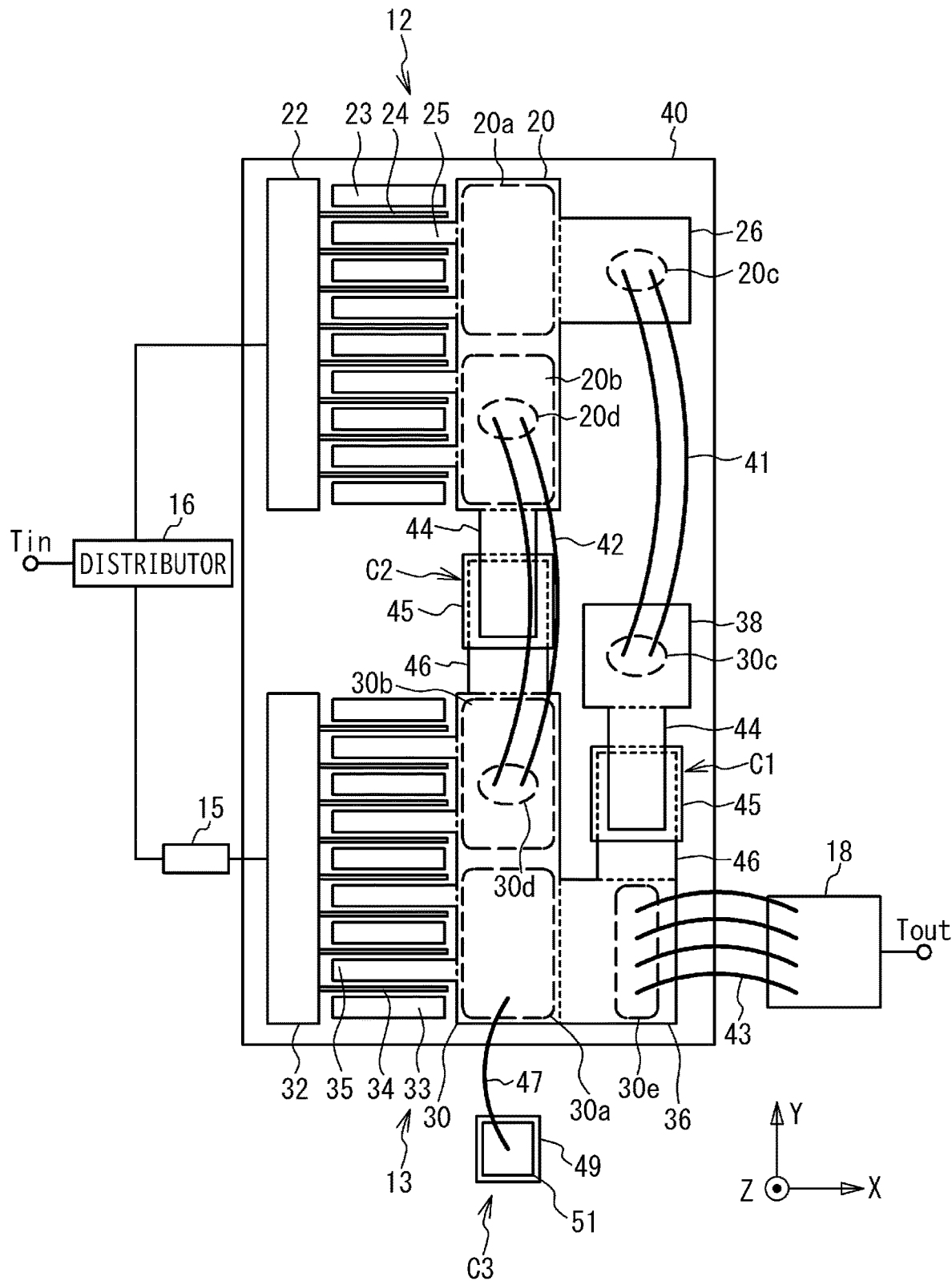
FIG. 15 is a plan view of the Doherty amplifier in the third embodiment.

FIG. 15 is a plan view of the Doherty amplifier in the third embodiment. As illustrated in FIG. 15, the capacitor C3 includes a dielectric film 49, an upper electrode 51, and a lower electrode (not illustrated). A bonding wire 47 corresponds to the inductor L3 and connects the drain electrode 30 and the upper electrode 51. The lower electrode is connected to the ground. Other configurations are the same as those in the first embodiment, and the description thereof will be omitted.

According to the third embodiment, the harmonic processing circuit 48 is connected to the drain electrode 30 and processes the harmonic components of the signals amplified by the main amplifier 10 and the peak amplifier 11. By providing the harmonic processing circuit 48 in the drain electrode 30 corresponding to the synthesis point N1, the single harmonic processing circuit 48 can be used to process the harmonics of both the main amplifier 10 and the peak amplifier 11. Therefore, the Doherty amplifier can be reduced in size. The harmonic processing circuit 48 may be provided in the variations of the first embodiment, the second embodiment and the variations of the second embodiment.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. A Doherty amplifier comprising:
    a first amplifier that includes a plurality of first output fingers and a first output electrode connected to the plurality of first output fingers, amplifies one of two signals into which an input signal is distributed, and outputs an amplified signal to the first output electrode;
    a second amplifier that includes a plurality of second output fingers and a second output electrode connected to the plurality of second output fingers, amplifies another one of the two signals, and outputs an amplified signal to the second output electrode;
    a first bonding wire connected between a first region in the first output electrode and a second region in the second output electrode;
    a second bonding wire connected between a third region in the first output electrode closer to the second output electrode than the first region and a fourth region in the second output electrode closer to the first output electrode than the second region; and
    at least one of a first capacitor connected in series with the first bonding wire between the first region and the second region, and a second capacitor connected in parallel with the second bonding wire between the third region and the fourth region;
    wherein the first region and the third region are regions to which the plurality of first output fingers are connected,
    the second region and the fourth region are regions to which the plurality of second output fingers are connected, and
    the first amplifier and the second amplifier are arranged in a direction intersecting extension directions of the first output fingers and the second output fingers, respectively.

2. The Doherty amplifier according to claim 1, wherein the first output electrode is separated between the first region and the third region, and the second output electrode is separated between the second region and the fourth region.

3. The Doherty amplifier according to claim 1, wherein the first bonding wire does not intersect with the second bonding wire.

4. The Doherty amplifier according to claim 1, wherein the first region and the second region are connected to each other without through the third region and the fourth region, and the third region and the fourth region are connected to each other without through the first region and the second region.

5. The Doherty amplifier according to claim 1, wherein a signal output by the first amplifier and a signal output by the second amplifier are synthesized in the second output electrode.

6. The Doherty amplifier according to claim 5, further comprising:
    a harmonic processing circuit that is connected to the second output electrode and processes a harmonic component of the signals amplified by the first amplifier and the second amplifier.

7. The Doherty amplifier according to claim 1, wherein a capacitor included in the Doherty amplifier is the first capacitor.

8. The Doherty amplifier according to claim 1, wherein a capacitor included in the Doherty amplifier is the second capacitor.

9. The Doherty amplifier according to claim 1, wherein capacitors included in the Doherty amplifier are the first capacitor and the second capacitor.

* * * * *